United States Patent [19]

Carbonaro

[11] Patent Number: 5,041,742

[45] Date of Patent: Aug. 20, 1991

[54] STRUCTURED SCAN PATH CIRCUIT FOR INCORPORATING DOMINO LOGIC

[75] Inventor: Joseph Carbonaro, Austin, Tex.

[73] Assignee: Motorola, Inc., Schaumburg, Ill.

[21] Appl. No.: 520,904

[22] Filed: May 9, 1990

[51] Int. Cl.$^5$ ............... H03K 19/096; H03K 19/003; H03K 17/687

[52] U.S. Cl. .................................. 307/452; 307/448; 307/453; 307/481

[58] Field of Search ............... 307/448, 451, 452, 453, 307/443, 571, 576, 579, 585, 241, 481

[56] References Cited

U.S. PATENT DOCUMENTS

| | | | |
|---|---|---|---|
| 4,710,650 | 12/1987 | Shoji | 307/451 X |
| 4,764,691 | 8/1988 | Jochem | 307/452 X |
| 4,780,626 | 10/1988 | Guerin et al. | 307/452 X |
| 4,798,980 | 1/1989 | Sugiyama et al. | 307/452 X |
| 4,804,864 | 2/1989 | Spence | 307/452 X |

Primary Examiner—Stanley D. Miller
Assistant Examiner—David R. Bertelson
Attorney, Agent, or Firm—Charlotte B. Whitaker

[57] ABSTRACT

A design for a structured scan path circuit incorporating domino logic circuitry is provided. The scan path circuit allows the rapid evaluation of a predetermined logic function, while allowing the use of automatic test pattern generation programs. Each function input signal has its own latch, the equivalent to the master latch in a standard scan flip-flop. The domino function output also has a latch, the equivalent of the slave latch in the scan flip-flop. The use of the input latches eliminates the need to insure the stability of the function input signals during the evaluation of the domino logic function. Thus, the input latches eliminate the potential "hazard" problems which can occur due to the instability of the input signals during evaluation of the domino logic function. A scan enable signal selectively enables and disables the function evaluation by the domino logic circuitry. Thus, the function evaluation may be disabled for a "capture" interval, to allow the scan circuit to scan in a scan data value, and scan out the same scan data value, via the slave on the function output. The scan circuit also incorporates decoder circuitry to further increase the speed at which the scan path circuit evaluates the logic function.

12 Claims, 3 Drawing Sheets

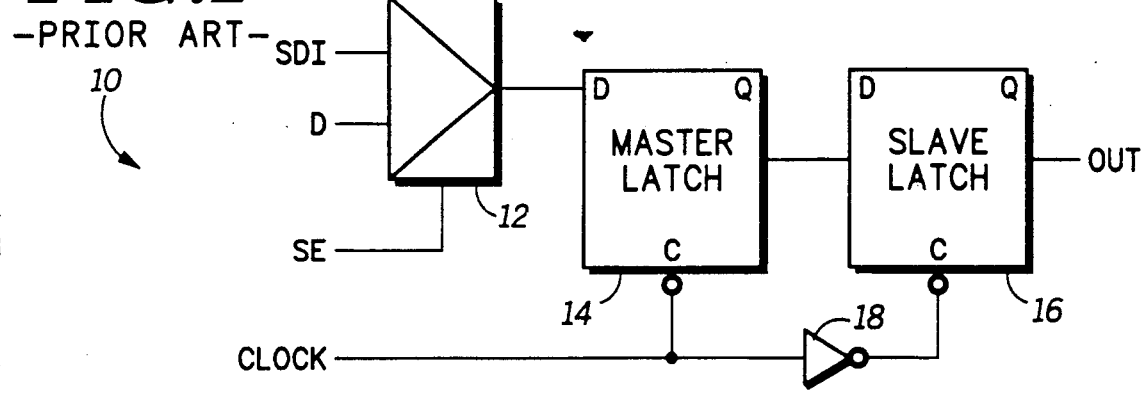
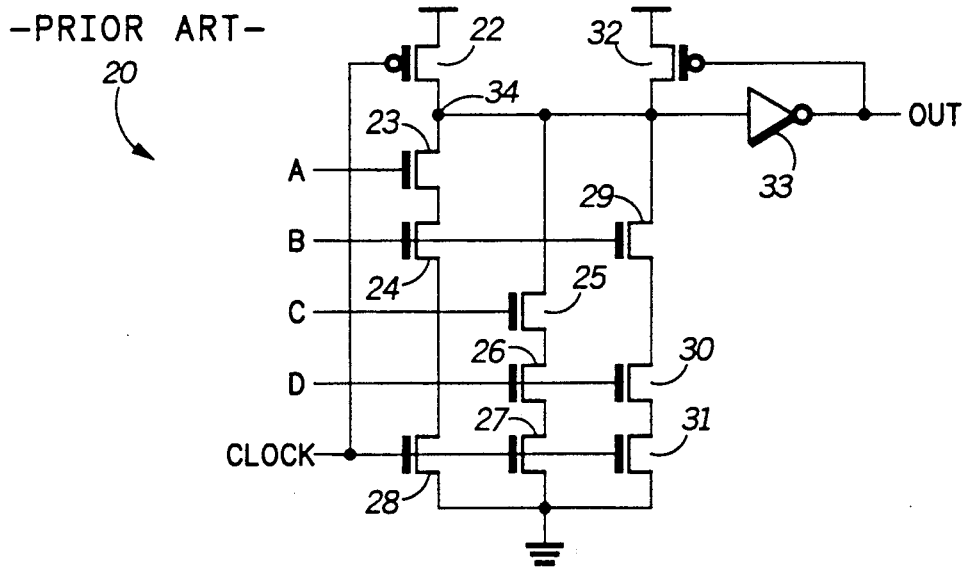
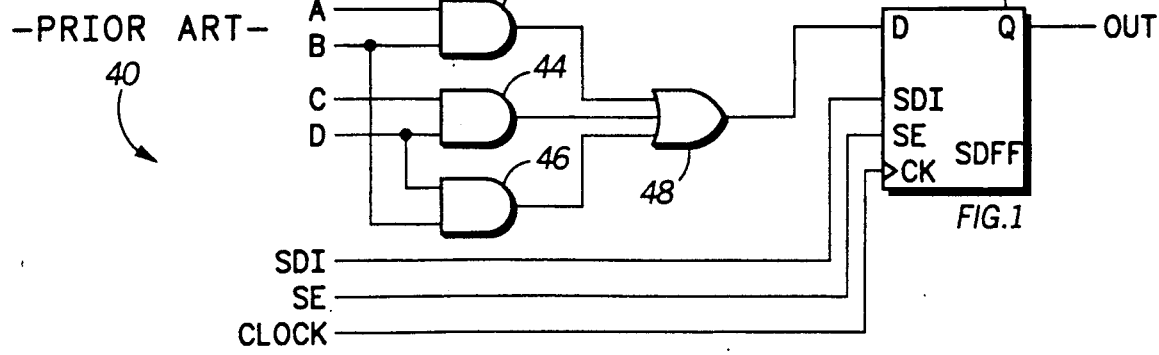

STRUCTURED SCAN PATH CIRCUIT FOR INCORPORATING DOMINO LOGIC

FIELD OF THE INVENTION

This invention relates generally to the structured scan path circuits, and more particularly to structured scan path circuits using domino logic.

BACKGROUND OF THE INVENTION

The ever increasing complexity of today's integrated circuits presents new engineering problems in the field of test generation. Historically, test generation for integrated circuits occurred manually, and generally, at the end of the circuit design cycle. Consequently, the quality and fault coverage of the test program suffered. In order to address the numerous problems associated with testing more complex and sequential integrated circuit, scan-based design methodologies were developed. These scan-based design methodologies simplify the testing of complex circuits by partitioning the overall circuit into a collection of small, combinational logic blocks. Structured testing of the combinational logic systems, used to implement VLSI circuits, requires the use of test patterns (vectors) consisting of every possible input state for the combinational logic block under test. Typically, these test patterns are generated using some form of computer automated test pattern generation (ATPG) software. Accordingly, the optimum structured test methodology is one designed to facilitate its use with the ATPG software.

FIG. 1 illustrates a standard scan structure using a D-type scan Master-Slave flip-flop 10 (SDFF), for use with ATPG software. This SDFF 10 receives either a scan data input (SDI) or a normal data input (D), from scan input multiplexor 12, in response to the activation of the scan enable (SE) signal. For example, when the SE signal is a logic low, the normal data (D) input signal is scanned into a master latch 14, when the CLOCK signal is a logic low, and stored. When the CLOCK signal switches to a logic high, the D input is transferred to a slave latch 16. Conversely, when the SE signal is a logic high, the scan data input (SDI) signal is scanned into the master latch 14 (when the CLOCK signal is a logic low), and subsequently transferred to the slave latch 16, when the CLOCK signal switches to a logic high. Thus, the master latch 14 passes the input signal (D or SDI) when the CLOCK signal is a logic low, and the slave latch 16 receives and passes the input signal when the CLOCK signal switches to a logic high.

Typically, in a structured design, all storage elements in the design may be set to a specific logic value. Accordingly, using the structure shown in FIG. 1, a SDI value is scanned into the SDFF 10 when the scan enable (SE) signal is active, and "captured" when the SE signal is disabled. During the "capture" interval, the SDI value is presented to the actual logic (i.e. combinational logic block) for evaluation, and the resultant data value(s) scanned out for analysis. Proper operation of the D-type scan element requires that the input signal be stable for a few nanoseconds before the device is clocked (the set-up time), and the data must remain stable for a few nanoseconds after the clocking is initiated (hold-time). Thus, although the D-type scan element allows the use of ATPG programs, thereby reducing the time and manpower required for test generation, it requires more set-up time than other storage elements. Consequently, when designing structured logic, one of the issues is how to resolve the circuit problem of insufficient set-up time for a standard scan flip-flop.

In cases where structured design guidelines are not required, domino logic may be employed where necessary to allow for short set-up times and to provide high performance. Domino logic does not, however, fit within the current specifications for ATPG programs, therefore, the circuit designer must manually generate the test patterns for the domino logic portion of the circuitry. FIG. 2 illustrates a domino logic circuit 20 for implementing the function $(A*B)+(C*D)+(B*D)$. The circuit comprises p-channel transistors 22 and 32, n-channel transistors 23,24,25,26,27,28,29,30, and 31, and an inverter 33. When the CLOCK signal is a logic low, transistor 22 precharges a node 34 to a logic high value. When the CLOCK signal switches to a logic high value, the domino logic function is evaluated. The input signals A, B, C, and D must be stable at all times during the interval of time in which the CLOCK signal is a logic one. If the input signals A, B, C, or D are unstable, charge sharing may occur, causing the precharged node 34 to be discharged. The discharging of the precharge node 34 causes the output (OUT) to toggle, and provide an erroneous output signal. This occurrence is typically referred to as a "hazard" problem. Generally, there is no recovery from the "hazard" problem during the current clock phase. Domino logic evaluates the function exceptionally fast, however, due to this "hazard" sensitivity, it generally does not fit within the current structured design guidelines or ATGP capabilities. The actual operation of the domino logic circuitry will be explained later.

Shown in FIG. 3 is a logic diagram of a circuit 40 for implementing the same function $((A*B)+(C*D)+(B*D))$ incorporating scan path design. The circuit 40 comprises three AND gates 42, 44 and 46, an OR-gate 48, and the scan data flip-flop (SDFF) 10 of FIG. 1. This scan circuit 40 captures the evaluation of the decode function at the rising edge of the CLOCK signal. Although scan circuit 40 eliminates the requirement that the inputs remain stable whenever the CLOCK is a logic one, it requires more set-up time than the domino logic circuit 20 of FIG. 2. Furthermore, implementation of circuit 40 requires more transistors than the domino logic circuit 20 (FIG. 2).

SUMMARY OF THE INVENTION

Accordingly, it is an object of the present invention to provide an improved structured scan path design.

These and other objects of the present invention are accomplished in a scan path circuit comprising: a first logic portion for receiving and storing a plurality of input signals, in response to a clock signal having a first logic value, the first logic portion providing a first set of outputs each having a logic value corresponding to a logic value of a predetermined one of the plurality of input signals; a second logic portion coupled to the first logic portion for receiving the first set of outputs, for decoding the first set of outputs, and for providing a second set of outputs, each having a logic value corresponding to a predetermined logic function; a third logic portion having a plurality of logic branches coupled to the second logic portion for receiving the second set of outputs, and for providing a third output signal, in response thereto; and a fourth logic portion coupled to the third logic portion for receiving and storing the third output signal, in response to the clock signal having a second logic value, the fourth logic portion providing the third output signal as a function output signal, when the clock signal switches to the first logic state, the function output signal indicating the functionality of the circuit.

These and other features of the invention will be apparent from the detailed description and claims to follow, taken in conjunction with the accompanying drawings.

BRIEF DESCRIPTION OF THE DRAWINGS

FIG. 1 is a block diagram illustrating a known scannable D-type Master-Slave flip-flop.

FIG. 2 is a circuit diagram illustrating a known domino logic circuit implementation for a predetermined logic function.

FIG. 3 is a logic diagram illustrating a known logic circuit for implementing the logic function of FIG. 2.

DETAILED DESCRIPTION OF THE INVENTION

Figure 4:
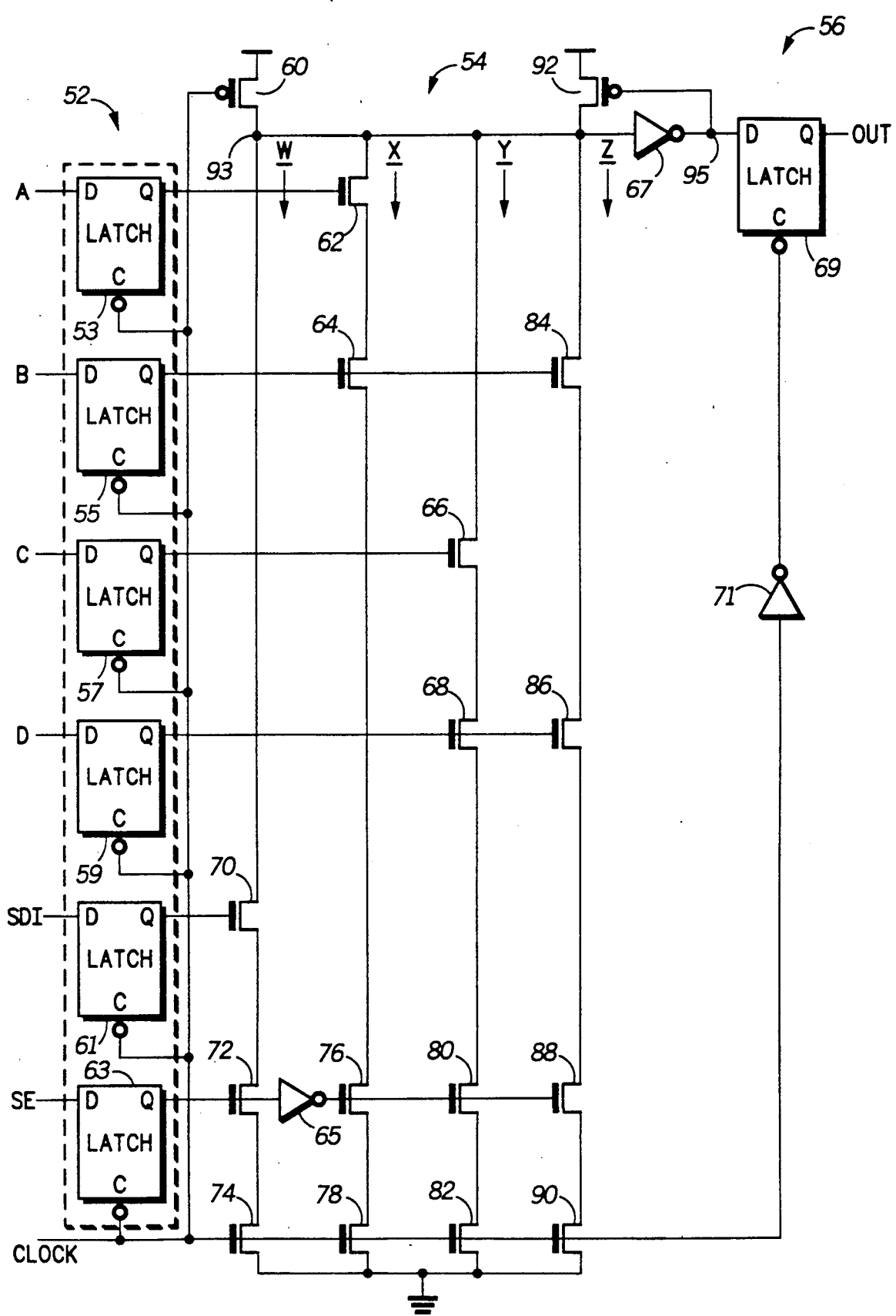
FIG. 4 illustrates in a partial schematic diagram form a structured scan path design incorporating the domino logic circuit of FIG. 2 in accordance with an embodiment of the present invention.

Shown in FIG. 4 is a partial circuit diagram illustrating a structured scan circuit 50, in accordance with a first embodiment of the present invention. The scan circuit 50 is comprised of input latch circuitry 52, domino logic circuitry 54, and output latch circuitry 56. In the present invention, the input latch circuitry 52 comprises six (6) D-type master latches 53,55,57,59,61 and 63. Each input A, B, C, D, scan data (SDI) and scan enable (SE) has its own latch, 53,55,58,59,61 and 63 respectively, which is the equivalent to the master latch 14 in the scan-flip flop of FIG. 1. The outputs of the master latches 53,55,57,58,59, and 61 are selectively coupled to the inputs of the domino logic circuitry 54, for decoding and evaluating the domino logic function. Upon completion of the function evaluation, the result is provided to the output latch circuitry 56, which is equivalent to the slave latch 16 in the SDFF 10. Thus, the scan circuit 50 implements the same decode function as shown in FIGS. 2 and 3, by incorporating domino logic into a structured scan path design.

In accordance with the present invention, the domino logic circuitry 54 comprises p-channel transistors 60 and 92, and four logic branches W, X, Y, and Z. In the present invention, logic branch W comprises n-channel transistors 70,72 and 74. Logic branches X and Y comprise n-channel transistors 62,64,76,78, and 66,68,80 and 82, respectively. Similarly, logic branch Z comprises n-channel transistors 84,86,88 and 90. Transistor 60 has a gate for receiving the CLOCK signal, a source connected to a positive power supply terminal ($V_{DD}$), and a drain connected to a precharge node 93. Transistor 62 has a gate for receiving the A input signal from master latch 53, a source connected to the precharge node 93, and a drain. Transistor 64 has a gate for receiving the B input signal from master latch 55, a source connected to the drain of transistor 62, and a drain. Transistor 66 has a gate for receiving the C input signal from master latch 57, a source connected to the precharge node 93, and a drain. Transistor 68 has a gate for receiving the D input signal from master latch 59, a source connected to the drain of transistor 66, and a drain. Transistor 70 has a gate for receiving the SDI input signal from master latch 61, a source connected to the precharge node 93, and a drain. Transistor 72 has a gate for receiving the SE input signal from master latch 63, a source connected to the drain of transistor 70, and a drain. Transistor 74 has a gate for receiving the CLOCK signal, a source connected to the drain of transistor 72, and a drain connected to a negative power supply terminal, shown as ground.

Inverter 65 has an input connected to master latch 63 for receiving the SE signal, and an output for providing a complementary SE signal (SE*). Transistor 76 has a gate for receiving the SE* signal, a source connected to the drain of transistor 64, and a drain. Transistor 78 has a gate for receiving the CLOCK signal, a source connected to the drain of transistor 76, and a drain connected to ground. Transistor 80 has a gate for receiving the SE* signal, a source connected to the drain of transistor 68, and a drain. Transistor 82 has a gate for receiving the CLOCK signal, a source connected to the drain of transistor 80, and a drain connected to ground. Transistor 84 has a gate for receiving the B input signal from master latch 55, a source connected to precharge node 93, and a drain. Transistor 86 has a gate for receiving the D input signal from master latch 59, a source connected to the drain of transistor 84, and a drain. Transistor 88 has a gate for receiving the SE* signal, a source connected to the drain of transistor 86, and a drain. Transistor 90 has a gate for receiving the CLOCK signal, a source connected to the drain of transistor 88, and a drain connected to ground. Inverter 67 has an input connected to the precharge node 93, and an output for providing a domino output signal at a node 95. Transistor 92 has a gate connected to the output of inverter 67, a source connected to $V_{DD}$, and a drain connected to the precharge node 93.

The output latch circuitry 56 is coupled to the output of the domino logic circuitry 54. Accordingly, slave latch 69 has an input for receiving the domino output signal, and an output for providing a scan circuit 50 output (OUT) signal. Inverter 71 has an input for receiving the CLOCK signal, and an output for providing a complementary CLOCK signal (CLOCK*) to the slave latch 69. Scan circuit 50 provides a novel arrangement of existing design methodologies (e.g. domino logic) to function within the restrictions of structured design and automatic test pattern generation (ATPG) programs. In normal operation, the master latches 53,55,57,59,61, and 63 are enabled when the CLOCK signal is a logic low, thus allowing the input signals to be passed thru their respective latches. The actual decode function is evaluated at the rising edge of the CLOCK signal. Input signals A, B, C, and D may be any of a variety of control or data signals (i.e. reset, retry system control signals). Similarly, the scan data input (SDI) signal is a test input which is scanned into scan circuit 50, when the scan enable (SE) signal is a logic high value. For illustrative purposes only, the operation of the scan circuit 50 will be described in conjunction with input signals having the following logic values: A=1; B=0, C=1, D=1, SE=0, SDI=0.

When the CLOCK signal switches to a logic low, transistor 60 becomes conductive, and charges the precharge node 93 to a logic high voltage level. Consequently, inverter 67 receives at its input a logic high, and operates to provide a logic low signal to node 95.

Thus, the weak p-channel transistor 92 is conductive. In response to the logic low CLOCK signal, input latches 53,55, 57,59,61, and 63 pass the logic value of their respective input signals A, B, C, D, SDI and SE. Due to the logic low CLOCK signal, transistors 74,78, 82 and 90 are non-conductive. Since both the SE and SDI input signals are a logic low, transistors 70 and 72 are non-conductive, therefore, the domino logic function is evaluated normally. Inverter 65 receives the logic low SE signal, and provides a logic high signal, thereby causing transistors 76,80, and 88 to become conductive. Input signals A, C and D are a logic "1", therefore, master latches 53,57 and 59 provide logic high signals, thereby causing transistors 62, 66,68 and 86 to become conductive. When input signal B is a logic "0", master latch 55 provides a logic low signal, causing transistors 64 and 84 become non-conductive.

Once the CLOCK signal switches to a logic high, transistors 74,78, 82 and 90 become conductive, and p-channel transistor 60 becomes non-conductive. Logic branch W of scan circuit 50 does not discharge the precharge node 93, however, since transistors 70 and 72 are non-conductive. Since transistor 64 is non-conductive, logic branch X does not discharge the precharge node 93. Conversely, since transistors 66,68,80 and 82 are conductive, logic branch Y provides a path to ground, and thus discharges the voltage at the precharge node 93. As a result, inverter 67 receives a logic low signal, and provides a logic high domino output signal at node 95, thus, the weak p-channel transistor 92 is non-conductive. The CLOCK signal is a logic high, therefore, inverter 71 operates to provide a logic low signal to the slave latch 69. The slave latch 69 is enabled, in response to the logic low CLOCK signal, and passes the logic value of the domino output signal as the scan circuit output (OUT) signal.

Scan circuit 50 operates in the scan mode whenever the SE signal is a logic "1" value. In the present invention, the SE input signal is used to disable the evaluation of the domino logic function by the domino logic circuitry 54. Essentially, the SE input signal disables the evaluation of logic branches X, Y and Z, and enables the evaluation of logic branch W. Consequently, the domino output signal follows the SDI input signal, and ignores the normal domino logic function (i.e. (A*B)+(C*D)+B*D)) evaluation. Accordingly, when the CLOCK signal is a logic low, the master latch circuitry 52 passes the logic value of the input signals (A, B, C, D, SDI and SE), and transistor 60 precharges node 93. When the CLOCK signal switches to a logic high state, transistors 74,78,82, and 90 become conductive, and the master latch circuitry 52 holds the input signals to the domino logic circuitry 54. Inverter 65 receives the logic high SE signal, and operates to provide a logic low signal to the gates of transistors 76,80, and 88 which become non-conductive. Consequently, logic branches X, Y and Z do not discharge node 93, regardless of the logic values of input signals A, B, C and D. Thus, the logic value of the SDI signal is determinative of the OUT signal provided by the slave latch 69. In the case where the SDI is a logic "0" value, transistor 70 is non-conductive, and logic branch W does not discharge the voltage at the precharge node 93. The input to inverter 67 is, therefore, a logic high value, and inverter 67 operates to provide a logic low domino output signal at node 95. In response to the logic low value at node 95, the weak p-channel transistor 92 remains conductive, and operates to maintain the logic high at the input to inverter 67.

When the CLOCK signal is a logic high, the slave latch 69 is enabled and continues to pass the logic low domino output signal to the function OUT signal, until the CLOCK signal switches to a logic low during the "capture" interval. During the "capture" interval, the SE signal is disabled (logic low), therefore, the resultant value stored in slave latch 69 is scanned out for analysis. The use of the slave latch 69 on the domino logic 54 function output keeps the scan circuit 50 OUT signal from going to zero every time the CLOCK signal causes transistor 60 to precharge node 93. Thus, the output slave latch 69, and the use of the SE signal to disable the function evaluation, make the scan circuit 50 behave like the logic circuit 40 of FIG. 3, while allowing the use of ATPG programs. Thus, the present invention allows the incorporation of domino logic into a structured scan path design, thereby allowing the use of ATPG programs.

Figure 5:
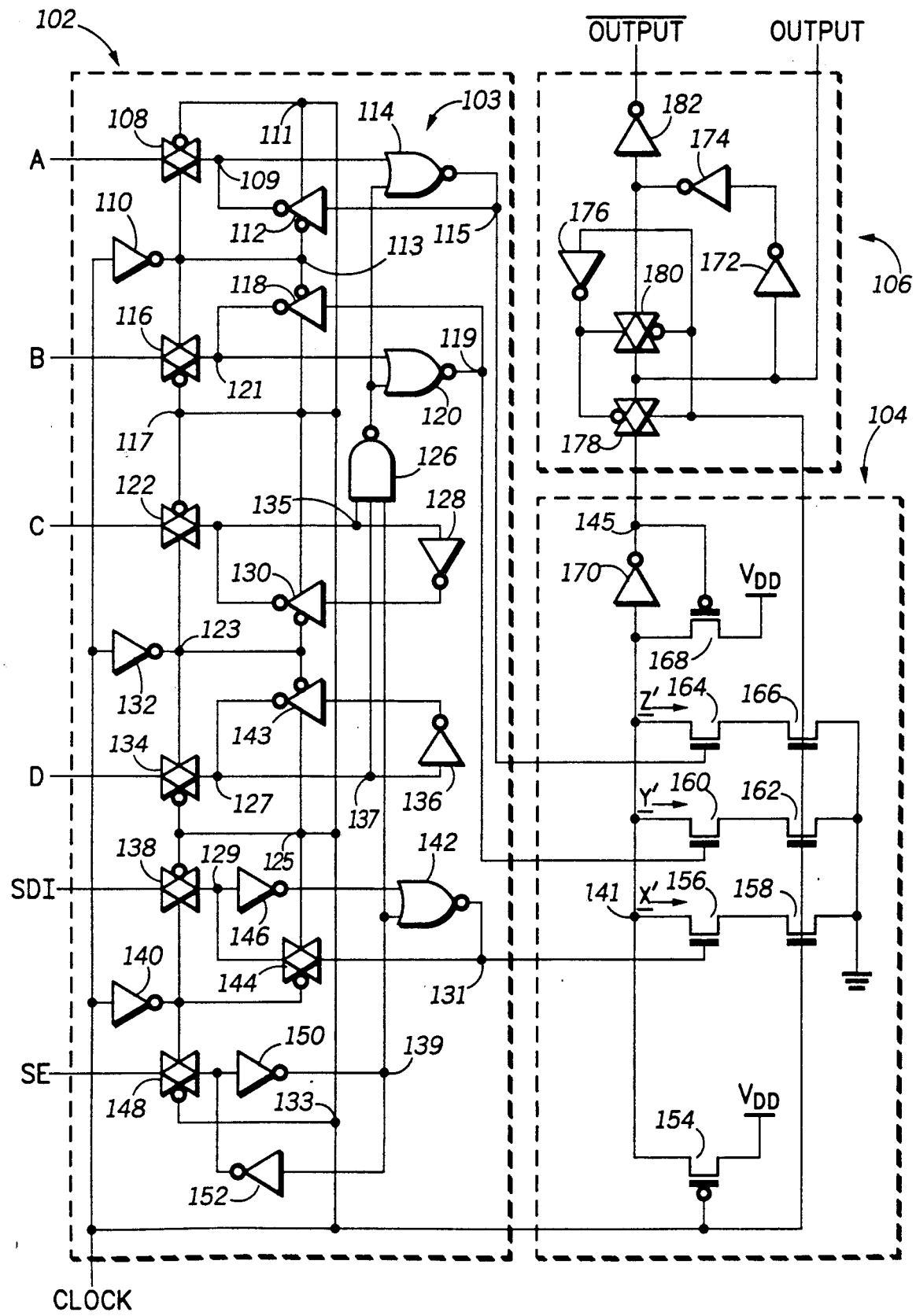
FIG. 5 is a circuit diagram illustrating an optimized structured scan path design incorporating a different domino logic circuit in accordance with a preferred embodiment of the present invention.

Shown in FIG. 5 is a scan circuit 100, according to a preferred embodiment of the present invention, which allows the completion of a decode of the function variables (i.e. (A+B)*C*D), and provides a function evaluation of the domino logic circuitry 104 at a significantly increased speed. In the preferred embodiment, scan circuit 100 comprises master latch circuitry 102, domino logic circuitry 104, and output latch circuitry 106. In the present invention, the master latch circuitry 102 incorporates decoder circuitry 103 comprised of NOR-gates 114,120, and 142, and NAND-gate 126. The master latch circuitry 102 further comprises CMOS transmission gates 108,116, 122, 134,138,144, and 148; inverters 110,128,132,140,146,150 and 152; and clocked-inverters 112,118,130, and 143. Domino logic circuitry 104 comprises p-channel transistors 154 and 168, n-channel transistors 156,158,160, 162,164, and 166, and inverter 170. Output slave latch circuitry 106 comprises transmission gates 178 and 180, and inverters 172,174,176 and 182.

Transmission gates 108,116,122,134,138,144, and 148, and clocked-inverters 112,118,130, and 143 each have true and inverted clock inputs or control inputs, and first and second terminals. Signals received by the true and inverted clock inputs are complements of each other. In the case of the transmission gates 108,116,122,134,144, and 148, when the true clock input is a logic high, a conductive path is formed between the first and second terminals. Whereas, for the clocked-inverters 112,118,130 and 143, when the true clock input is a logic high, the signal received at the input terminal is inverted. Otherwise, for both, an open circuit is provided between the first and second terminals. The CLOCK signal is inverted by inverters 110,132 and 140 to provide the complementary clock signal (CLOCK*). Accordingly, inverter 110 has an input for receiving the CLOCK signal, and an output for providing the CLOCK* signal. Transmission gate 108 has a true clock input connected to the output of inverter 110, an inverted clock input connected to a node 111, a first terminal for receiving the A input signal, and a second terminal connected to node 109, for providing the A output signal. Clocked-inverter 112 has a true clock input connected to a node 111, an inverted clock input connected to a node 113, an input terminal connected to a node 115, and an output terminal connected to a node 109.

Transmission gate 116 has a true clock input connected to the output of inverter 110, an inverted clock input connected to node 117, an input terminal for receiving the B input signal, and an output terminal for providing the B output signal. Clocked-inverter 118 has a true clock input connected to node 117, an inverted clock input connected to node 113, an input terminal connected to node 119, and an output terminal connected to node 121. Inverter 132 has an input for receiving the CLOCK signal, and an output for providing the CLOCK* signal. Transmission gate 122 has a true clock input connected to the output of inverter 132, an inverted clock input connected to the node 117, and an input terminal for receiving the C input signal, and an output terminal for providing the C output signal. Inverter 128 has an input connected to node 135, and an output. Clock-inverter 130 has a true clock input connected to node 117, an inverted clock input connected to the output of inverter 132, an input terminal connected to the output of inverter 128, and an output terminal connected to node 135. Inverter 136 has an input connected to node 127, and an output. Clocked-inverter 143 has a true clock input connected to a node 125, an inverted clock input connected to the output of inverter 132, an input terminal connected to the output of inverter 136, and an output terminal connected to a node 127. Transmission gate 134 has a true clock input connected to the output of inverter 132, an inverted clock input connected to node 125, a first terminal for receiving the D input signal, and an output for providing the D output signal.

In the preferred embodiment of the present invention, the SE disable circuitry of scan circuit 100 is slightly different from that of scan circuit 50 (FIG. 4), however, the function of the SE disable circuitry is essentially the same in both the scan circuit 50 and scan circuit 100. Inverter 140 has an input for receiving the CLOCK signal, and an output for providing the CLOCK* signal. Transmission gate 138 has a true clock input connected to the output of inverter 140, an inverted clock input connected to node 125, a first terminal for receiving the SDI input signal, and a second terminal for providing the SDI output signal. Inverter 146 has an input for receiving the SDI signal, and an output for providing a complementary SDI signal (SDI*). Transmission gate 144 has a true clock input connected to node 125, an inverted clock input connected to the output of inverter 140, a first terminal connected to a node 129, and a second terminal connected to a node 131. Transmission gate 148 has a true clock input connected to the output of inverter 140, an inverted clock input connected to a node 133, a first terminal for receiving the SE input signal, and a second terminal for providing the SE output signal. Inverter 150 has an input connected to the second terminal of transmission gate 148 for receiving the SE signal, and an output for providing a complementary SE signal (SE*). Inverter 152 has an input connected to a node 139, and an output terminal connected to the input terminal of inverter 150.

In the preferred embodiment of the present invention, the decoder circuitry 103 is coupled to the domino logic circuitry 104, in a manner which controls the operation of the logic branches X', Y', and Z'. NAND-gate 126 has a first input connected to node 135 for receiving the C input signal, a second input connected to node 137 for receiving the D input signal, a third input connected to node 139 for receiving the complementary SE (SE*) signal, and an output. NOR-gate 114 has a first input connected to node 109 for receiving the A input signal, a second input connected to the output of NAND-gate 126, and an output for controlling the operation of logic branch Z'. NOR-gate 120 has a first input connected to node 121 for receiving the B input signal, a second input connected to output of NAND-gate 126, and an output for controlling the operation of logic branch Y'. NOR-gate 142 has a first input for receiving the SDI* signal, a second input connected to node 139 for receiving the SE* signal, and an output for controlling the operation of logic branch X'.

FIG. 5 illustrates a domino logic circuitry 104 for evaluation the function (A+B)*C*D, therefore, the domino logic circuitry 104 of scan circuit 100 is different from that of scan circuit 50. Furthermore, the modifications made to the SE disable circuitry facilitate a reduction in the number of transistors required in each of the three logic branches X', Y', and Z'. Essentially, in the preferred embodiment, the C and D input signals are used in conjunction with the SE input signal to provide a disable for the domino logic circuitry, with respect to inputs A and B. The precharge transistor 154 has a gate connected to the CLOCK signal, a source connected to $V_{DD}$, and a drain connected to a precharge node 141. Logic branch X' comprises transistors 156 and 158. Transistor 156 has a gate connected to the output of NOR-gate 142, a source connected to precharge node 141, and a drain. Transistor 158 has a gate connected to the CLOCK signal, a source connected to the drain of transistor 156, and a drain connected to ground. Logic branch Y' comprises transistors 160 and 162. Transistor 160 has a gate connected to node 119, a source connected to precharge node 141, and a drain. Transistor 162 has a gate connected to the CLOCK signal, a source connected to the drain of transistor 160, and a drain connected to ground. Logic branch Z' comprises two transistors 164 and 166. Transistor 164 has a gate connected to node 115, a source connected to the precharge node 141, and a drain. Transistor 166 has a gate connected to the CLOCK signal, a source connected to the drain of transistor 164, and a drain connected to ground. Inverter 170 has an input connected to the precharge node 141, and an output. Transistor 168, a weak p-channel transistor, has a gate connected to the output of inverter 170, a source connected to $V_{DD}$, a drain connected to the input of inverter 170.

The output slave latch circuitry 106 is also modified in the preferred embodiment, and differs from the output slave latch 69 of FIG. 4. Inverter 176 has an input for receiving the CLOCK signal, and an output for providing the complementary signal CLOCK*. Transmission gate 178 has a true clock input for receiving the CLOCK signal, an inverted clock input for receiving the complementary signal CLOCK*, a first terminal connected to node 145, and a second terminal for providing a result (OUTPUT) of the function evaluation. Inverter 172 has an input connected to the second terminal of transmission gate 178, and an output. Inverter 174 has an input connected to the output of inverter 172, and an output. Transmission gate 180 has a true clock input connected to the output of inverter 176, an inverted clock input for receiving the CLOCK signal, a first terminal connected to the output of inverter 174, and a second terminal connected to the input of inverter 172. Inverter 182 has an input connected to the output of inverter 174, and an output for providing a complementary result (OUTPUT*) of the function evaluation.

Scan circuit 100 operates in a similar manner as the scan circuit 50 of FIG. 4. Referring again to the example given wherein the input control signals had the following logic values: A=1, B=0, C=1; D=1, SE=0, and SDI=0. As discussed earlier, these input signals (the function inputs to the domino logic circuitry 104) represent various system control signals. Once again, the SE signal is disabled, therefore, the scan circuit 100 will evaluate the domino logic in a normal mode, and the SDI signal is ignored. In response to a logic low CLOCK signal, transmission gates 108, 116, 122, and 134 become conductive, and transfer input signals A, B, C, D, respectively, into the master latch circuitry 102. Accordingly, node 109 is a logic high, node 121 a logic low, and nodes 135 and 137 are at a logic high level. Transmission gate 148 couples the logic low SE input signal to the inverter 150, which operates to provide a logic high value at node 139. NAND-gate 126 receives the logic low inputs at nodes 135 and 137, and the logic high input at node 139, and provides a logic high output signal to NOR-gates 114 and 120. In response to the logic high signal from NAND-gate 126, and the logic high input at node 109, NOR-gate 114 provide a logic low at node 115. Similarly, in response to the logic low input at node 121, and the logic high signal from NAND-gate 126, NOR-gate 120 provides a logic low at node 119. Transmission gate 138 couples the logic low SDI input signal to inverter 146, and inverter 146 provides a logic high signal at the input to NOR-gate 142. In response to the logic high input from inverter 146, and the logic high value at node 139, NOR gate 142 provides a logic low at node 131.

When the CLOCK signal is a logic low value, precharge transistor 154 charges node 141 to a logic high level. In the preferred embodiment of the present invention, the logic level at nodes 115, 119, and 131 determines the conductive states of transistors 164, 160 and 156, respectively. Since nodes 115, 119, and 131 are at a logic low level, transistors 164, 160 and 156, respectively, are non-conductive. Thus, when the CLOCK signal switches to a logic high value, thus causing transistors 158, 162, and 166 to become conductive, logic branches X', Y', and Z' do not discharge node 141. Consequently, inverter 170 provides a logic low value at node 145. In response to the logic low value at node 145, the weak p-channel transistor 168 remains conductive, and operates to maintain the logic high input to inverter 170.

When the CLOCK signal is a logic high, transmission gate 178 is conductive, and couples the logic low domino output signal to the scan circuit OUTPUT, which in the preferred embodiment represents the result of the evaluation of the domino logic function (A+B)*C*D. Transmission gate 180 is non-conductive, due to the logic high CLOCK signal applied to the inverted clock input, therefore, the slave latch 106 passes the logic low domino output signal to the OUTPUT. Inverter 172 receives the logic low domino output signal, and provides a logic high output signal to inverter 174, which reinverts the logic high output signal to its original polarity, thereby providing a logic low output signal to inverter 182. Inverter 182 operates to provide a complementary domino logic function OUTPUT* signal for scan circuit 100. Accordingly, inverter 182 inverts the logic low output signal to provide a logic high signal as the OUTPUT* of scan circuit 100.

Since transmission gate 180 is non-conductive, the output signal from inverter 170 is passed through the slave latch 106, until the CLOCK signal switches to a logic low, thereby initiating the next function evaluation phase. When the CLOCK signal switches to a logic low, transmission gate 180 becomes conductive, and maintains the logic low domino output signal by providing the logic low domino output to the scan circuit OUTPUT. Once again, inverter 182 inverts the logic low domino output signal and provides the logic high complementary domino logic function OUTPUT* signal.

Scan circuit 100 operates in the scan mode whenever the SE signal is a logic "1" value. In the preferred embodiment of the present invention, the disable circuitry for the functional evaluation of the domino logic is somewhat different than that of scan circuit 50 (FIG. 4). When the CLOCK signal is a logic low, gates 108, 116, 122, 134, 138, and 148 transfer their respective input signals, A, B, C, D, SDI and SE into the master latch circuitry 102, and transistor 154 charges node 141 to a logic high voltage level. Referring again to the example provided, the input signals have following logic values A=1, B=0, C=1, D=1, therefore, nodes 109, 135, and 137 are a logic high value, and node 121 is a logic low value. Since the SE signal is a logic high, inverter 150 provides a logic low signal at node 139. NAND-gate 126 receives both the logic low signal at node 139, and the logic high signals at nodes 135 and 137, and provides a logic high signal to NOR-gates 114 and 120. As a result, NOR-gate 114 receives the logic high signal from NAND-gate 126, the logic high A input signal, and provides a logic low signal to the gate of transistor 164. Similarly, NOR-gate 120 receives the logic high signal from NAND-gate 126, the logic low B input signal, and provides a logic low signal to the gate of transistor 160. Consequently, transistors 160 and 164 are non-conductive.

In the present example, the SDI input signal is a logic low, therefore, inverter 146 provides a logic high signal to NOR-gate 142. In the scan mode, the SE signal functions to disable all but the SDI input to the domino logic circuitry 104, therefore, the logic value of the SDI signal determines the logic value of the function OUTPUT signal. Accordingly, NOR-gate 142 receives the logic high signal (SDI*) from inverter 146, and the logic low signal (SE*) at node 139, and provides a logic low signal to the gate of transistor 156, thereby causing transistor 156 to be non-conductive. When the CLOCK signal switches to a logic high, transistors 158, 162, and 166 become conductive. However, since transistors 156, 160 and 164 are non-conductive, logic branches X', Y' and Z' do not discharge the logic high voltage at the precharge node 141. Consequently, inverter 170 receives a logic high input, provides a logic low domino output signal to the output slave latch 106. Since the CLOCK signal is a logic high, transmission gate 178 is conductive, and provides the logic low domino output signal as the scan circuit OUTPUT. Transmission gate 180 is non-conductive, due to the logic high CLOCK signal applied to the inverted clock input, therefore, the slave latch 106 passes the logic level of the domino output signal, while simultaneously providing the logic low signal as the OUTPUT of scan circuit 100. Inverter 172 receives the logic low domino output signal, and provides a logic high signal to inverter 174, which reinverts the logic high signal, thereby providing a logic low signal to inverter 182. Inverter 182 operates to provide the OUTPUT* signal of scan circuit 100.

When the CLOCK signal switches again to a logic low, during the next function evaluation phase, transistor 156 precharges node 141 to a logic high value. The slave latch 106 is closed, due to the logic loww CLOCK signal applied to the true clock input of transmissin gate 178, therefore, the logic state of the previous function output signal is isolated from the next function output signal. In response to the logic low CLOCK signal, transmission gate 180 passes the logic low, domino output signal to inverter 172, which inverts the signal, and provides a logic high signal to inverter 174. Inverter 174 reinverts the logicc high signal to it original polarity, thereby providing a logic low signal to inverter 182. Similarly, inverter 182 providdes a logic high signal as the OUTPUT* of scan circuit 100.

It should now be apparent that the present invention provides a design for a structured scan path circuit 100 which incorporates domino logic circuitry 102, thereby allowing the rapid evaluation of a predetermined logic function, while allowing the use of automatic test pattern generation programs. The scan circuit 100 uses master latch circuitry 102 which eliminates the need to insure the stability of the function input signals during the evaluation of the domino logic function. Thus, the use of the master latch circuitry 102 eliminates the potential "hazard" problem which occurs due to the instability of the input signals when the CLOCK signal switches to a logic high state. Using the SE signal, the function evaluation may be disabled for a "capture" interval, to allow the scan circuit 100 to scan in an SDI value, and scan out the SDI signal, via a slave latch 106 on the function output. The use of the decoder circuitry 103, further increases the speed at which scan circuit 100 evaluates the domino logic function.

While the present invention has been described in a preferred embodiment, it will be apparent to those skilled in the art that the disclosed invention may be modified in numerous ways and may assume many embodiments other than that specifically set out and described above. For example, although the latches used for implementation of the present invention are enabled in response to a logic low CLOCK signal, the polarity may be changed to enable the latches in response to a logic high CLOCK signal. Furthermore, whereas the present invention has been descirbed in conjunction with a predetermined domino logic function (i.e.- (A*B)+(C*D)+(B*D)), it should be apparent that this particular logic function is provided for illustrative purposes only, that the present invention may be used in conjunction with many other domino logic functions.

I claim:

1. A scan path circuit comprising:
   first means for receiving and storing a plurality of input signals, in response to a clock signal having a first logic value, said first means providing a first set of outputs each having a logic value corresponding to a logic value of a predetermined one of said plurality of input signals;
   second means coupled to said first means for receiving said first set of outputs, for decoding said first set of outputs, and for providing a second set of outputs, each having a logic value corresponding to a predetermined logic function;
   third means having a plurality of logic branches coupled to said second means for receiving said second set of outputs, and for providing a third output signal, in response thereto; and
   fourth means coupled to said third means for receiving and storing said third output signal, in response to said clock signal having a second logic value, said fourth means providing said third output signal as a function output signal, when said clock signal switches to said first logic state, the function output signal indicating the functionality of said circuit.

2. The scan path circuit of claim 1 wherein said first means comprises a plurality of storage units for storing the logic value of each of said plurality of input signals, a selected one of said storage units receiving a scan enable signal to allow the transfer of a scan data bit to said second means.

3. The scan path circuit of claim 2 wherein said second means comprises a decoder circuit, coupled to said plurality of storage units for implementing said first predetermined logic function, in response to receiving said first set of output signals, said decoder circuit comprising:
   a first NOR-gate having a first input for receiving a first output signal in said first set of outputs, a second inpout, and an output for selecting a first logic branch in said plurality of logic branches;
   a second NOR-gate having a first input for receiving a second output signal in said first set of outputs, a second input, and an output for selecting a second logic branch in said plurality of logic branches;
   a NAND-gate, having a first input for receiving a third output signal in said first set of outputs, a second input for receiving a fourth output signal in said first set of outputs, a third input for receiving the scan enable signal, and an output coupled to said second inputs of said first and said second NOR-gates; and
   a third NOR-gate having a first input for receiving a scan data signal, and a second input for receiving said enable signal, and an output for selecting a third branch in said plurality of logic branches.

4. The scan path circuit of claim 3 wherein said third means comprises a domino logic circuit for evaluating said predetermined logic function, in response to said scan enable signal having said first logic value, and for disabling evaluation of said predetermined logic function and scanning in said scan data signal, in response to said scan enable signal having said second logic value.

5. The scan path circuit of claim 1 wherein said fourth means is an output slave latch.

6. A scan path incorporating domino logic for evaluating a predetermined logic function encoded within said scan path circuit, said scan path circuit comprising:
   first storage means for receiving and storing a plurality of input signals, in response to a clock signal having a first logic state, and for providing a first set of output signals;
   decoder means coupled to said storage means for receiving said first set of output signals, and for providing a second set of output signals, in response thereto, said second set of output signals representing an output of said predetermined logic function applied to the plurality of input signals;
   domino logic circuitry coupled to said decoder means having a predetermined number of logic branches for receiving said predetermined set of logic output signals, and for providing a third output signal, in response to said clock having a second logic state; and second storage means coupled to said domino logic circuitry for receiving and storing said third output signal, in response to said clock signal having said second logic state, and for providing said third output signal as a function output signal, in response to said clock signal switching to said first logic state.

7. The scan circuit of claim 6 wherein said decoder means selectively enables the evaluation of said domino logic circuitry, in response to a scan enable signal having said first logic state, and disables the evaluation of said domino logic circuitry in response to said scan enable signal having said second logic state, said decoder means comprising:

a first NOR-gate having a first input for receiving a first output signal in said first set of output signals, a second input, and an output for selecting a first logic branch in said domino logic circuitry;

a second NOR-gate having a first input for receiving a second output signal in said first set of output signals, a second input, and an output for selecting a second logic branch in said domino logic circuitry;

a NAND-gate having a first input for receiving a third output signal in said first set of output signals, a second input for receiving a fourth output signal in said first set of output signals, a third input for receiving the scan enable signal, and an output coupled to said second inputs of said first and said second NOR-gates; and a third NOR-gate having a first input for receiving a complementary scan data signal, an a second input for receiving said complementary scan enable signal, and an output for selecting a third branch in said domino logic circuitry.

8. The scan path circuit of claim 7 wherein said domino logic circuitry comprises:

precharge means for precharging an input node, in response to said clock signal having said first logic state;

evaluation means coupled to said precharge means for receiving said second set of output signals, for determining a logical value of said predetermined logic function, and for providing said logic value, in response to said clock signal having said second logic state; and output means coupled to said evaluation means and said second storage means for receiving said logical value, and for providing a function output signal, corrèsponding to said logic value, to said second storage means.

9. The scan path circuit of claim 8 wherein said second storage means is a slave latch for storing said function output signal, in response to said clock signal being in said second logic state, and for providing said function output signal as a scan circuit output, in response to said clock signal switching to said first logic state.

10. A scan path circuit incorporating domino logic for evaluating a predetermined logic function, and scan path circuit comprising:

storage means for receiving and storing a plurality of input signals, and for receiving and storing an output signal representative of an evaluation of said predetermined logic function, said storage means disabling and enabling evaluation of said predetermined logic function, in response to a scan enable signal, said storage means comprising:

master latch circuitry for receiving and stoing said plurality of input signals, and for providing a set of output signals, in response to a clock signal having a first logic state;

slave latch circuitry for receiving and storing the output signal, in response to said clock signal having a second logic state; and domino logic circuitry, having a plurality of inputs coupled to said master latch circuitry, and an output coupled to said slave latch circuitry for providing a function output signal to said slave latch, and having a plurality of inputs for receiving said set of outputs signals from said master lach circuitry, and selectively enabled for evaluating said predetermined logic function, and selectively disabled for providing a scan data signal to said slave latch circuitry.

11. The scan circuit of claim 10 wherein said domino logic circuitry comprises:

precharge means for precharging an input node, in response to said clock signal having said first logic state;

evaluaion means coupled to said precharge means for receiving said first set of output signals, and for selectively evaluating said predetermined logic function, in response to an enable signal having said first logic state, and for receiving said scan data signal, and providing said scan data signal to said storage means, in response to said scan enable signal having said second logic state; and output means coupled to said evluation means and said slave latch circuitry, for providing either said function output signal or said scan data signal to said second storage means.

12. The scan circuit of claim 11 wherein said storage means provides said scan enable signal to said domino logic circuitry, thereby enabling or disabling the evaluation of said predetermined logic function, said domino logic circuitry providing said function output signal in response to being enabled and providing said scan data signal in response to be disabled.

* * * * *

REEXAMINATION CERTIFICATE (1776th)
United States Patent [19]

Carbonaro

[11] B1 5,041,742

[45] Certificate Issued Aug. 18, 1992

[54] STRUCTURED SCAN PATH CIRCUIT FOR INCORPORATING DOMINO LOGIC

[75] Inventor: Joseph Carbonaro, Austin, Tex.

[73] Assignee: Motorola, Inc., Schaumburg, Ill.

Reexamination Request:
No. 90/002,553, Feb. 10, 1992

Reexamination Certificate for:
Patent No.: 5,041,742
Issued: Aug. 20, 1991
Appl. No.: 520,904
Filed: May 9, 1990

[51] Int. Cl.⁵ .............. H03K 19/096; H03K 19/003; H03K 17/687
[52] U.S. Cl. .................................. 307/452; 307/448; 307/453; 307/481
[58] Field of Search ............... 307/452, 453, 465, 480, 307/481, 443; 371/22.2, 22.3, 22.5, 22.6; 324/73.1, 158 R

[56] References Cited
U.S. PATENT DOCUMENTS 4,856,002  8/1989  Sakashita et al. ............... 371/21
4,974,226  11/1990  Fujimori et al. ............... 371/22.3

*Primary Examiner*—David R. Hudspeth

[57] ABSTRACT

A design for a structured scan path circuit incorporating domino logic circuitry is provided. The scan path circuit allows the rapid evaluation of a predetermined logic function, while allowing the use of automatic test pattern generation programs. Each function input signal has its own latch, the equivalent to the master latch in a standard scan flip-flop. The domino function output also has a latch, the equivalent of the slave latch in the scan flip-flop. The use of the input latches eliminates the need to insure the stability of the function input signals during the evaluation of the domino logic function. Thus, the input latches eliminate the potential "hazard" problems which can occur due to the instability of the input signals during evaluation of the domino logic function. A scan enable signal selectively enables and disables the function evaluation by the domino logic circuitry. Thus, the function evaluation may be disabled for a "capture" interval, to allow the scan circuit to scan in a scan data value, and scan out the same scan data value, via the slave on the function output. The scan circuit also incorporates decoder circuitry to further increase the speed at which the scan path circuit evaluates the logic function.

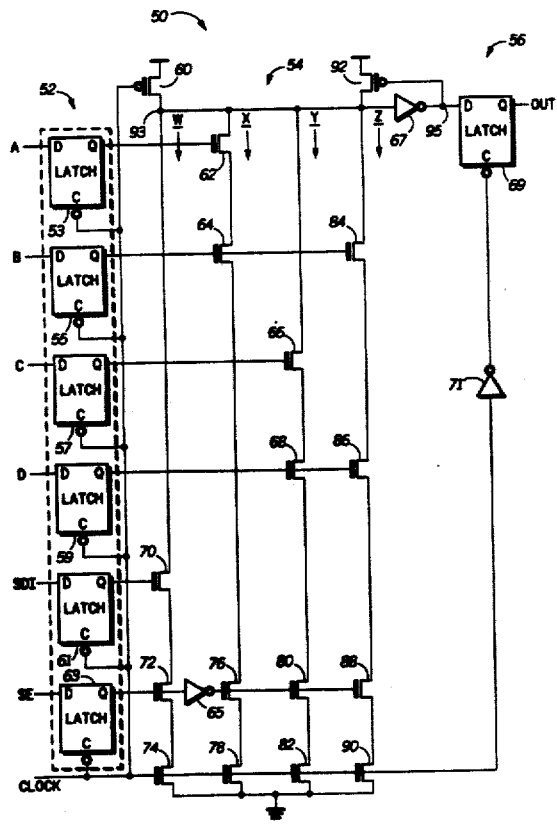

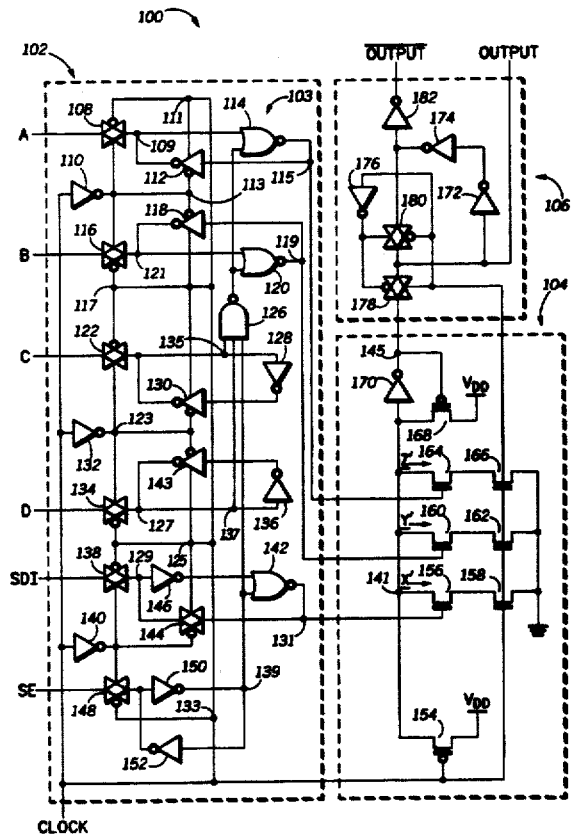

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION IT HAS BEEN DETERMINED THAT:

The patentability of claims 1-9 is confirmed.

Claim 10 is determined to be patentable as amended.

Claims 11 and 12 dependent on an amended claim, are determined to be patentable.

10. A scan path circuit incorporating domino logic for evaluating a predetermined logic function, and scan path circuit comprising:

storage means for receiving and storing a plurality of input signals, and for receiving and storing an output signal representative of an evaluation of said predetermined logic function, said storage means disabling and enabling evaluation of said predetermined logic function, in response to a scan enable signal, said storage means comprising:

master latch circuitry for receiving and [stoing] *storing* said plurality of input signals, and for providing a set of output signals, in response to a clock signal having a first logic state;

slave latch circuitry for receiving and storing the output signal, in response to said clock signal having a second logic state; and domino logic circuitry, having a plurality of inputs coupled to said master latch circuitry, and an output coupled to said slave latch circuitry for providing a function output signal to said slave latch, and having a plurality of inputs for receiving said set of outputs signals from said master [lach] *latch* circuitry, and selectively enabled for evaluating said predetermined logic function, and selectively disabled for providing a scan data signal to said slave latch circuitry.

* * * * *